US 8,354,700 B2

United States Patent
Seger et al.

(10) Patent No.: US 8,354,700 B2
(45) Date of Patent: Jan. 15, 2013

(54) IMAGE SENSOR AND METHOD FOR MANUFACTURING AN IMAGE SENSOR

(75) Inventors: Ulrich Seger, Leonberg-Warmbronn (DE); Roland Schmid, Stuttgart (DE); Uwe Apel, Neckartailfingen (DE); Gerald Franz, Backnang (DE); Andreas Reppich, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/143,058

(22) PCT Filed: Nov. 2, 2009

(86) PCT No.: PCT/EP2009/064454
§ 371 (c)(1), (2), (4) Date: Sep. 16, 2011

(87) PCT Pub. No.: WO2010/076063
PCT Pub. Date: Jul. 8, 2010

(65) Prior Publication Data
US 2012/0001287 A1    Jan. 5, 2012

(30) Foreign Application Priority Data
Jan. 2, 2009 (DE) .......................... 10 2009 000 001

(51) Int. Cl.
*H01L 31/062* (2012.01)
(52) U.S. Cl. ................ 257/291; 257/432; 257/E27.133; 257/E31.075
(58) Field of Classification Search ............ 438/66, 438/72, 75, 144; 257/222, 225, 233, 234, 257/291, 292, 294, 431, 432, 440, 443, E31.075, 257/E31.078, E31.081, E31.086, E27.159, 257/E27.16, E27.132, E27.133, E27.141
See application file for complete search history.

(56) References Cited

U.S. PATENT DOCUMENTS

| | | | |
|---|---|---|---|
| 4,345,011 A | 8/1982 | Drexhage | |
| 7,796,174 B1 * | 9/2010 | Harwit et al. | 348/311 |
| 2005/0231618 A1 | 10/2005 | Sugiyama | |
| 2006/0267054 A1 * | 11/2006 | Martin et al. | 257/291 |

FOREIGN PATENT DOCUMENTS

| | | |
|---|---|---|
| DE | 10 2004 001556 | 8/2005 |
| DE | 10 2005 047127 | 5/2006 |
| JP | 540 78 026 | 6/1979 |
| JP | 561 61 679 | 12/1981 |
| JP | 591 23 259 | 7/1984 |
| JP | 63 122 168 | 5/1988 |
| JP | 5 090550 | 4/1993 |

OTHER PUBLICATIONS

International Search Report for PCT/EP2009/064454, dated May 30, 2011.

* cited by examiner

*Primary Examiner* — Brook Kebede
(74) *Attorney, Agent, or Firm* — Kenyon & Kenyon LLP

(57) ABSTRACT

An image sensor and a method for manufacturing an image sensor are described in which the image sensor includes at least one substrate having a plurality of light-sensitive elements forming a sensor field and first microfilter elements for wavelength-selective filtering of incident light. The first microfilter elements are attached to a transparent carrier made of glass or a transparent film, for example. A first microfilter element is situated in front of a portion of the light-sensitive elements for wavelength-selective filtering of light striking the light-sensitive element. No microfilter element is situated in front of a further portion of the light-sensitive elements.

15 Claims, 3 Drawing Sheets ered image sensor.

IMAGE SENSOR AND METHOD FOR MANUFACTURING AN IMAGE SENSOR

FIELD OF THE INVENTION

The present invention relates to an image sensor and method for manufacturing an image sensor.

BACKGROUND INFORMATION

Image sensors having a matrix-type configuration of light-sensitive elements, i.e., pixels, are designed in particular using CMOS or CCD technology.

Image sensors may be used for various applications. One field of application is the use for an image processing system in a driver assistance system. Depending on the function of such a driver assistance system, it is necessary to image the entire color space of an object to be recorded, for example, the surroundings of a vehicle, with good color fidelity or to subdivide objects into approximate color classes. So-called three-chip cameras, having one spectral channel each for red, green and blue are used for electronic image recording with high color fidelity. A camera includes, in addition to the image sensor, optical elements in particular, such as lenses, polarizers or filters. In addition, it is known that cameras having image sensors may be used, in which a color filter, typically a red, green or blue filter, is situated in front of the individual light-sensitive elements. This filter configuration is known as a "color mosaic filter." The mosaic configuration depends on the intended use of the camera. One of the most conventional filter patterns is the Bayer pattern, which allows good color separation in the entire CIE (International Commission on Illumination) color space.

In semiconductor-based image sensors, thin on-chip mosaic filter layers made of organic materials which selectively filter light spectrally, depending on its composition, are typically used for the color separation. The mosaic filter layers are thus applied directly to the light-sensitive elements of the image sensor. The filter characteristic of such filters is usually transparent over a large spectral range, in particular in the infrared spectral range. For example, to be able to perform a color separation effectively, an additional filter unit is necessary for performing a damping of the infrared radiation, for example.

Additional filters are usually designed extensively to be a separate unit detached from the image sensor or to be an applied layer on optical elements. DE 10 2004 001 556 A1, for example, describes a camera having an image sensor, a separate filter unit being situated at a distance in front of a partial area of the image sensor. The filter unit is used to dampen the low beam light range, so that the sensitivity of the image sensor is preserved in the near infrared range.

SUMMARY OF THE INVENTION

According to the present invention, an image sensor is created, in which one wavelength-selective first microfilter element is mounted merely in front of a portion, or, a subset, of the light-sensitive elements. The microfilter elements are designed and mounted on a transparent carrier, which may thus be attached directly or indirectly as a whole to the substrate of the image sensor.

Due to the first microfilter elements, radiation striking the light-sensitive elements may be filtered selectively for small groups of light-sensitive elements, in particular also for individual light-sensitive elements. The first microfilter elements may be situated spatially uniformly distributed in front of the light-sensitive elements.

By attaching the first microfilter elements to a carrier, this enables the manufacture of the first microfilter elements in an independent process separately from the manufacture of the light-sensitive elements and possibly providing the light-sensitive elements with additional layers, for example, organic color filters. Manufacturing the first microfilter elements on a separate carrier allows the use of methods, e.g., lift-off methods, which are not suitable for semiconductor processing and which use materials for the first microfilter elements, for example, which would not be desirable in the manufacturing process of the light-sensitive elements and possibly of additional layers applied to the light-sensitive elements and could result in contamination of these elements, for example.

The first microfilter elements and the light-sensitive elements may have dimensions in the micrometer range. The maximum extension of a microfilter element and a light-sensitive element may be less than/equal to 100 μm, and may be less than/equal to 10 μm. The light-sensitive elements may be semiconductor-based, e.g., CMOS and/or CCD elements. The first microfilter elements may be designed to be interference filters or absorption filters, for example. The transparent carrier may be, for example, a glass or a transparent film.

The first microfilter elements may be configured in such a way that they block light at least in the near infrared range (NIR), i.e., in the wavelength range of approximately 780 nm to 1000 nm. Certain light-sensitive elements of the image sensor which are designed, for example, to have color filters for detection of color areas in the visible spectral range may be effectively protected in this way from overradiation due to NIR radiation by such first microfilter elements. This is true in particular of the spectral range of the visible red light adjacent to the NIR spectral range.

In the method according to the present invention for manufacturing such an image sensor, a plurality of first microfilter elements is applied to a transparent carrier. The carrier having the first microfilter elements attached to it is situated by (in front of) a plurality of light-sensitive elements in such a way that one first microfilter element is situated in front of a portion of the light-sensitive elements, in each case in front of one light-sensitive element, in such a way that light striking these light-sensitive elements is filtered through a first microfilter element.

The present invention is explained in greater detail below on the basis of exemplary embodiments, which are illustrated in several figures.

DETAILED DESCRIPTION

Figure 1:
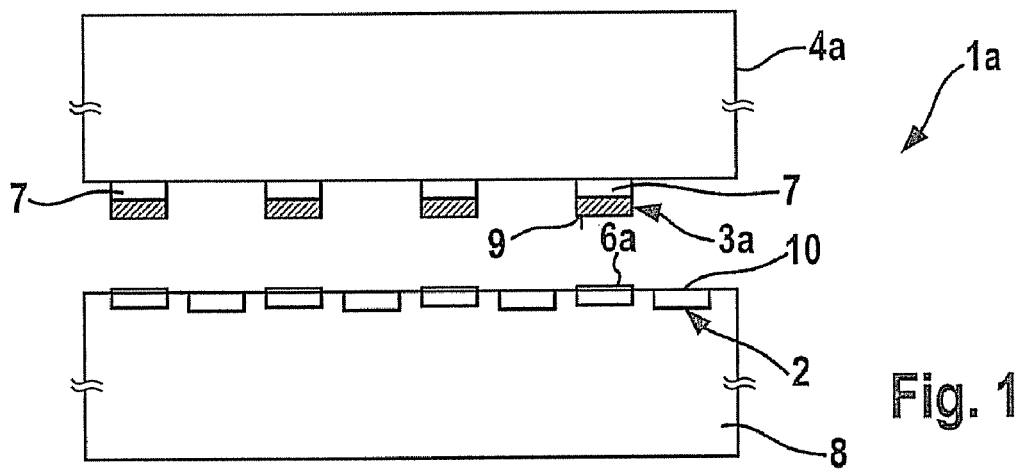
FIG. 1 shows a first specific embodiment of an image sensor before joining a carrier having first microfilter elements attached thereon to a substrate having light-sensitive elements.

The same or corresponding components are provided with the same reference numerals in the figures.

Figure 2:
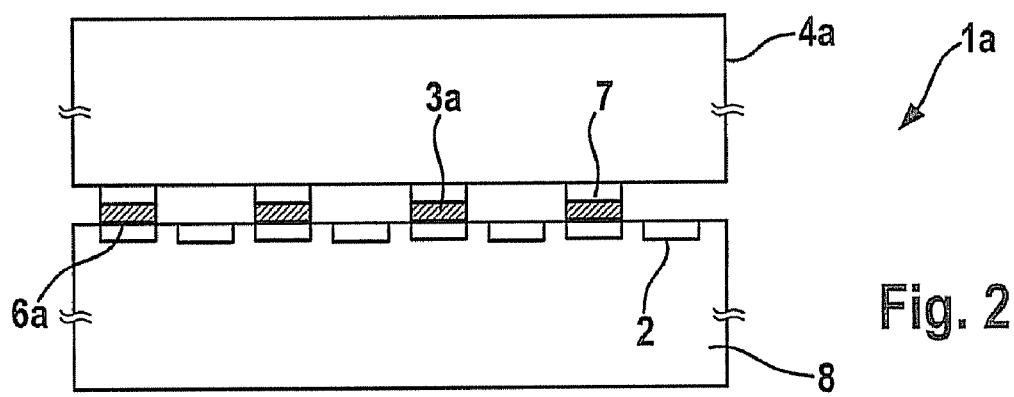
FIG. 2 shows the image sensor according to the first specific embodiment after joining the carrier to the substrate.

FIGS. 1 and 2 schematically show a first specific embodiment of an image sensor 1a according to the present invention, each shown in a cross-sectional view. For the purpose of better recognizability of the individual elements, the figures have not been drawn true to scale.

Figure 3:
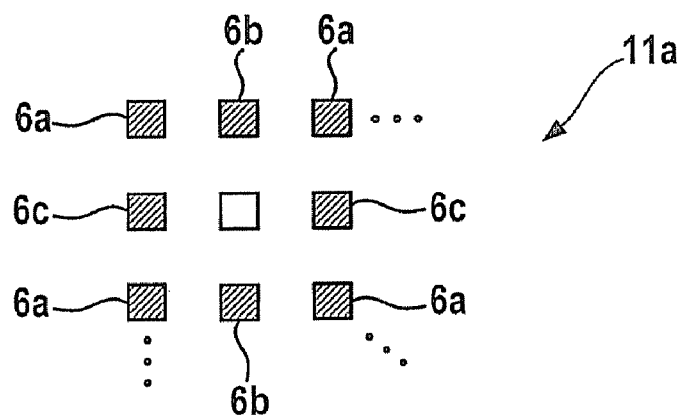
FIG. 3 shows a top view onto a sensor field formed by the light-sensitive elements of the image sensor of the first specific embodiment.

Image sensor 1a includes a plurality of light-sensitive elements 2, forming a sensor field 11a (see FIG. 3), a plurality of first microfilter elements 3a and a transparent carrier 4a, to whose surface first microfilter elements 3a are attached. Light-sensitive elements 2 are designed to be diffused diodes in a silicon substrate 8 in this exemplary embodiment and are designed to be CMOS sensors. Alternatively, light-sensitive elements 2 may also be designed to be CCD sensors, for example. Carrier 4a is formed by a transparent glass substrate.

First microfilter elements 3a are designed to be interference filters for blocking light in the near infrared range. Their extent is adapted to the extent of light-sensitive elements 2, so that a single microfilter element 3a may be situated to provide cover in front of a light-sensitive element 2 but does not cover any adjacent light-sensitive elements 2. Surface 9 of a first microfilter element opposite a light-sensitive element is designed as a square having a side length of 6 μm. This corresponds essentially to the side length of light-sensitive element 2, which is also designed to have a square surface 10. The thickness of a first microfilter element 3a and a light-sensitive element 2 is less than this value.

A color filter, namely here a color filter made of an organic material, is applied to surface 10 of a light-sensitive element 2 on a subset of light-sensitive elements 2. Of four adjacent light-sensitive elements 2 (see FIG. 3), a red filter 6a for filtering red light, a green filter 6b for filtering green light and a blue filter 6c for filtering blue light are applied to each light-sensitive element 2. The fourth light-sensitive element of this group of four remains uncovered by such a color filter. Color filters 6a, 6b, 6c correspond in their dimensions to surface 10 of light-sensitive elements 2.

First microfilter elements 3a are situated on the surface of carrier 4a in such a way that a first microfilter element 3a may be situated in front of a light-sensitive element 2, which is covered by a color filter 6a, 6b or 6c. Fourth light-sensitive element 2 of such a group of four thus remains uncovered by color filters 6a, 6b, 6c and second microfilter element 3a.

In addition, third microfilter elements 7 which are designed to be V-lambda filters are situated between second microfilter elements 3a and carrier 4a. V-lambda filters are known as such. They take into account the differing sensitivity of the eye for different wavelengths of visible light and filter the incident radiation thus accordingly. They correspond in their surface area here approximately to first microfilter elements 3a. However, as an alternative to this, V-lambda filters 7 may also be provided in the areas between the first microfilter elements and may thus also filter the light striking additional light-sensitive elements 2.

In this exemplary embodiment, first microfilter elements 3a and the V-lambda filters have been applied to carrier 4a in a separate process. For applying first and third microfilter elements 3a, 7, known microstructuring processes, which are not semiconductor-compatible, may be used, for example, a lift-off method. Carrier 4a having first microfilter elements 3a and the V-lambda filters is then situated upstream from light-sensitive elements 2 in such a way that the light-sensitive elements covered by a color filter are also covered by first microfilter elements 3a including V-lambda filters (see FIG. 2). First microfilter elements 3a are facing light-sensitive elements 2 and are situated over light-sensitive elements 2 essentially without any gap. This gap-free configuration of first microfilter elements 3a in front of light-sensitive elements 2 prevents a lateral underradiation of first microfilter elements 3a. Thin filter elements such as color filters 6a, 6b, 6c or thin protective layers are not apportioned to the gap here.

Light-sensitive elements 2 are sensitive over a spectral range which includes visible light and the near infrared. Image sensor 1a thus allows image recording in the visible spectral range as well as in the near infrared range. Since first microfilter elements are situated in front of color filters 6a, 6b, 6c, which block radiation in the near infrared, overradiation of the respective light-sensitive elements 2 is prevented. The V-lambda filters support color fidelity of the image recording. Light-sensitive elements 2 not covered by first microfilter elements 3a enable the NIR image recording. Since first microfilter elements 3a are spatially uniformly distributed in front of light-sensitive elements 2, in particular being adjacent to each light-sensitive element 2 in front of which a first microfilter element 3a is situated, there is a light-sensitive element 2 in front of which no first microfilter element is situated, so it is possible to use the entire sensor field formed by light-sensitive elements 2 for image recording in both spectral ranges, i.e., visible light and NIR. Furthermore, a high resolution is ensured.

Image sensor 1a may be used for a camera of a vehicle assistance system, for example, for image recording during day and night. V-lambda filters 7 may also be omitted.

Figure 4:
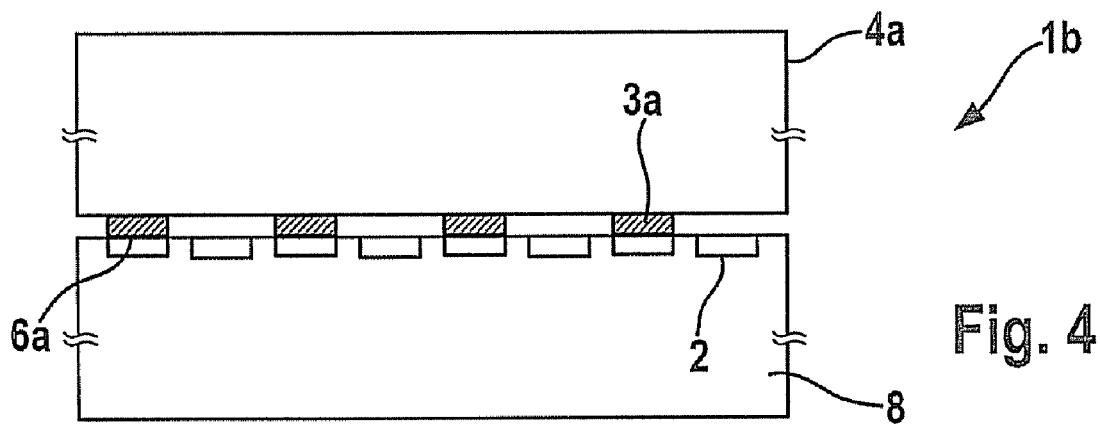
FIG. 4 shows a second specific embodiment of an image sensor according to the present invention.
Figure 5:
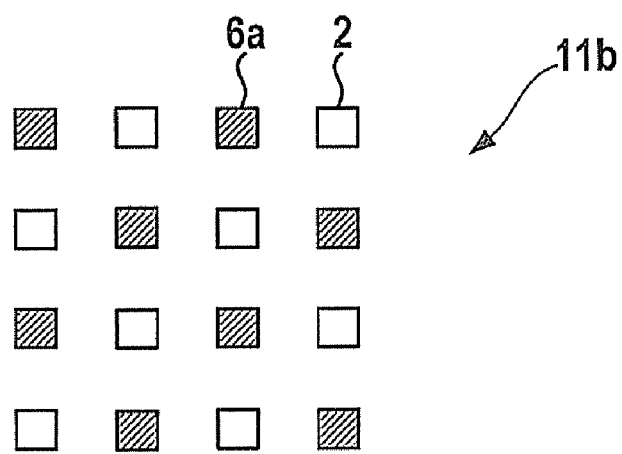
FIG. 5 shows a top view onto a sensor field formed by the light-sensitive elements of the image sensor of the second specific embodiment.

FIGS. 4 and 5 schematically show a second exemplary embodiment of an image sensor 1b according to the present invention. FIG. 4 shows a cross-sectional view of image sensor 1b, while FIG. 5 shows a sensor field of image sensor 1b.

Image sensor 1b includes a plurality of light-sensitive elements 2 forming a sensor field 11b, a plurality of first microfilter elements 3a and a transparent carrier 4a to which first microfilter elements 3a are attached. Carriers 4a, first microfilter elements 3a and light-sensitive elements 2, which are formed in a silicon substrate 8, are designed according to the elements of the first specific embodiment. However, image sensor 1b does not have any V-lambda filters 7, i.e., first microfilter elements 3a are attached directly to the surface of carrier 4a.

In contrast to the first specific embodiment, image sensor 1b as the second microfilter element includes only red filters 6a. The sensor surface of every second light-sensitive element 2 is covered by a red filter 6a (see FIG. 5). Red color filters 6a are spatially uniformly distributed over light-sensitive elements 2. First microfilter elements 3a are situated on carrier 4a in such a way that a single first microfilter element 3a is situated in front of a light-sensitive element 2, which is covered by a red color filter 6a. Those light-sensitive elements 2, which are not covered by a red color filter 6a, are thus also not covered by first microfilter elements 3a.

The manufacture of image sensor 1b may be implemented with the aid of the manufacturing method described within the scope of the first exemplary embodiment.

Image sensor 1b is suitable for applications in particular, in which it is desirable to separate individual spectral ranges, but sensitivity is impaired due to radiation from other spectral ranges, here the near infrared. In this exemplary embodiment, first microfilter elements 3a prevent NIR radiation from striking light-sensitive elements 2 covered by red color filters 6a. The red recognition of image sensor 1b is thus not impaired by NIR radiation. Such a sensor is suitable in particular for differentiating between red light and white light. A spectral range of white light in the near infrared is blocked by first microfilter elements 3a. Such an image sensor 1b may be used within the scope of a driver assistance system. Using such an image sensor 1b, it is possible to differentiate reliably whether a red brake light or a white backup light has been activated in another vehicle, for example. Using this information, the driver assistance system may initiate various measures, for example, output of a warning signal.

Figure 6:
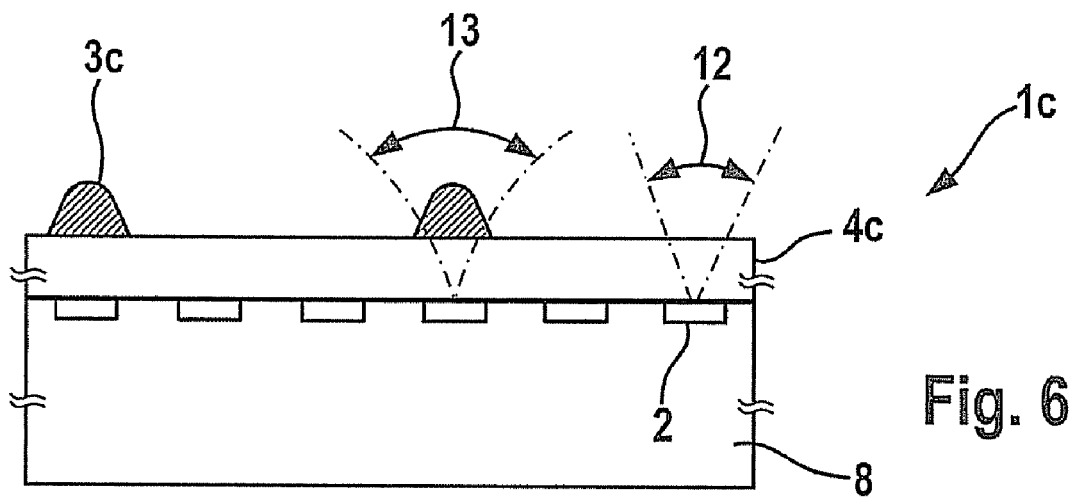
FIG. 6 shows a third specific embodiment of the image sensor according to the present invention.
Figure 7:
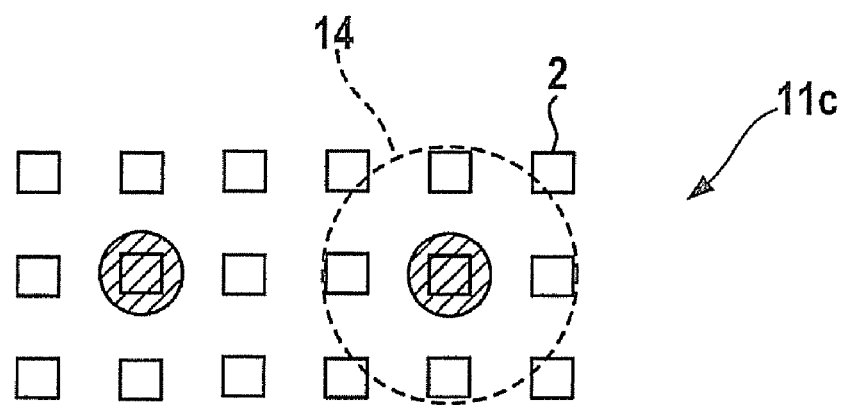
FIG. 7 shows a sensor field of the third specific embodiment of an image sensor according to the present invention, the sensor field being formed by the light-sensitive elements.

FIGS. 6 and 7 schematically show a third specific embodiment of an image sensor 1c according to the present invention. FIG. 6 shows a cross-sectional view of image sensor 1c; FIG. 7 shows a sensor field 11c of image sensor 1c formed by light-sensitive elements 2.

Image sensor 1c includes a plurality of light-sensitive elements 2, which form a sensor field 11c, a plurality of first microfilter elements 3c and a transparent carrier 4c, first microfilter elements 3c being attached to carrier 4c. Light-sensitive elements 2 are designed according to the first and second specific embodiments. In contrast to the previous exemplary embodiments, carrier 4c is designed to be a transparent flexible film 4c in this case. In addition, first microfilter elements 3c are designed to be lenses.

Carrier 4c together with first microfilter elements 3c is situated in front of light-sensitive elements 2 in such a way that a first microfilter element 3c is situated in front of a portion of light-sensitive elements 2, each being in front of one light-sensitive element 2, for filtering light striking light-sensitive elements 2. Microlenses 3c are spatially uniformly situated in front of light-sensitive elements 2. Carrier 4c is situated between first microfilter elements 3c and light-sensitive elements 2.

Microlenses 3c are designed in such a way that they widen detection space angle 12 of a single light-sensitive element 2 to an enlarged detection space angle 13. The thickness of carrier 4c may be adapted to the intended widening of the detection angle of a light-sensitive element 2. Due to this enlarged detection space angle 13, an effective volume, which is enlarged in comparison to that of light-sensitive elements 2 in front of which no microlens 3c is situated, may be assigned to light-sensitive elements 2 in front of which a microlens 3c is situated. This enlarged effective volume is represented by a circle 14 in FIG. 7. If light-sensitive elements 2, in front of which a microlens 3c is situated, are only thinly occupied, as also in this exemplary embodiment, in which only one light-sensitive element 2 of nine light-sensitive elements 2 is covered by a microlens 3c, then an underscanned image is formed. This underscanning has the effect of a low-pass filter. This is associated with the additional advantage that the development of moiré patterns is definitely reduced.

In this exemplary embodiment, microlenses 3c are designed to be absorption filters, here specifically NIR absorption filters. Because of their lens shape, they also allow a sufficiently large absorption volume in the micrometer range, in particular for NIR blocking. The maximum extension of a microlens 3c in this exemplary embodiment amounts to somewhat less than 10 μm.

In one exemplary embodiment of a manufacturing method for such an image sensor 1c, a plurality of microlenses 3c is manufactured on carrier 4c in a separate operation. Microlenses 3c may be manufactured by using known microstructuring methods, for example, a lift-off method. The lens shape may be achieved by thermal treatment of first microfilter elements 3c, for example, by partial melting. In a next step, carrier 4c having microlenses 3c attached to it is adjusted to light-sensitive elements 2.

A transparent glass may also be used as an alternative to a carrier 4c of a flexible film.

What is claimed is:

1. An image sensor, comprising:
   at least one substrate having a plurality of light-sensitive elements forming a sensor field; and
   first microfilter elements for wavelength-selective filtering of incident light, wherein the first microfilter elements are mounted on a transparent carrier, wherein at least one of the first microfilter elements is situated in front of a portion of the light-sensitive elements for wavelength-selective filtering of light striking the light-sensitive element, and wherein none of the first microfilter elements is situated in front of an additional portion of the light-sensitive elements.

2. The image sensor of claim 1, wherein the carrier is attached one of directly and indirectly to the substrate.

3. The image sensor of claim 1, wherein the light-sensitive elements are semiconductor based, and wherein they are at least one of CMOS sensors and CCD sensors.

4. The image sensor of claim 1, wherein in front of at least a portion of the light-sensitive elements, in front of which a first microfilter element is situated, and wherein a second microfilter element is configured as a red filter, which is transparent to red light.

5. The image sensor of claim 1, wherein it has third microfilter elements, which are configured as V-lambda filters, the third microfilter elements being attached to the carrier.

6. The image sensor of claim 1, wherein the first microfilter elements are at least one of interference filters and absorption filters.

7. The image sensor of claim 1, wherein at least a few first microfilter elements are configured as lenses for widening the detection space angle of incident light, and wherein the lenses are formed from a wavelength-selective-absorbing material.

8. The image sensor of claim 1, wherein the first microfilter elements are situated so as to be essentially gap-free over the light-sensitive elements.

9. The image sensor of claim 1, wherein the first microfilter elements are situated so as to be spatially uniformly distributed in front of the light-sensitive elements.

10. The image sensor of claim 1, wherein at least one light-sensitive element, in front of which none of the first microfilter elements is situated, is located adjacent to each light-sensitive element, in front of which a first microfilter element is situated.

11. The image sensor of claim 1, wherein the light-sensitive elements are configured so that they are sensitive in at least a partial range of the spectral range of the visible light and the near infrared, and wherein the first microfilter elements are configured so that they block light at least in the near infrared range.

12. The image sensor of claim 1, wherein the carrier is one of a transparent glass substrate and a transparent film.

13. A method for manufacturing an image sensor, the method comprising:
   providing a substrate including a sensor field of light-sensitive elements;
   applying first microfilter elements on a transparent carrier;
   attaching the carrier to the substrate so that at least one of the first microfilter elements is situated in front of a portion of the light-sensitive elements for filtering the light striking the light-sensitive element and none of the first microfilter elements is situated in front of another portion of the light-sensitive elements.

14. The method of claim 13, wherein the light-sensitive elements are formed on a substrate wafer, wherein the first microfilter elements are formed on or applied to a carrier wafer, and wherein the wafers are then joined and the image sensors are subsequently separated.

15. The method of claim 13, wherein the carrier is processed by one of a lift-off process and another non-semiconductor-compatible process.

* * * * *

UNITED STATES PATENT AND TRADEMARK OFFICE
CERTIFICATE OF CORRECTION

PATENT NO.       : 8,354,700 B2
APPLICATION NO.  : 13/143058
DATED            : January 15, 2013
INVENTOR(S)      : Seger et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 13 days.

Signed and Sealed this

First Day of September, 2015

Michelle K. Lee
*Director of the United States Patent and Trademark Office*